United States Patent
Spencer et al.

(10) Patent No.: US 7,867,335 B2
(45) Date of Patent: Jan. 11, 2011

(54) GAN BULK GROWTH BY GA VAPOR TRANSPORT

(75) Inventors: Michael G. Spencer, Ithaca, NY (US); Phani Konkapaka, Boise, ID (US); Huaqiang Wu, Sunnyvale, CA (US); Yuri Makarov, Midlothian, VA (US)

(73) Assignee: Cornell Research Foundation, Inc., Ithaca, NY (US)

( * ) Notice: Subject to any disclaimer, the term of this patent is extended or adjusted under 35 U.S.C. 154(b) by 1050 days.

(21) Appl. No.: 11/541,919

(22) Filed: Oct. 2, 2006

(65) Prior Publication Data

US 2007/0178671 A1 Aug. 2, 2007

Related U.S. Application Data

(63) Continuation of application No. PCT/US2005/011770, filed on Apr. 4, 2005.

(60) Provisional application No. 60/559,196, filed on Apr. 2, 2004.

(51) Int. Cl.
*C30B 21/02* (2006.01)

(52) U.S. Cl. .............................. 117/84; 117/89; 117/94; 117/104; 117/105

(58) Field of Classification Search .................... 117/84, 117/89, 94, 104, 105
See application file for complete search history.

(56) References Cited

U.S. PATENT DOCUMENTS

| | | | |
|---|---|---|---|
| 6,218,280 B1 * | 4/2001 | Kryliouk et al. | ............ 438/607 |
| 2004/0250747 A1 | 12/2004 | Sasaki et al. | |

FOREIGN PATENT DOCUMENTS

| | | |
|---|---|---|
| EP | 0937790 A2 | 8/1999 |
| EP | 1249522 A2 | 10/2002 |
| WO | WO-03006719 A1 | 1/2003 |
| WO | WO-2005111279 A2 | 11/2005 |
| WO | WO-2005111279 A3 | 11/2005 |

OTHER PUBLICATIONS

Kamler, G. , et al., "Bulk GaN single-crystals growth", *Journal of Crystal Growth*, 212(1-2_, (2000),39-48.

* cited by examiner

*Primary Examiner*—Robert M Kunemund
(74) *Attorney, Agent, or Firm*—Schwegman, Lundberg & Woessner, P.A.

(57) ABSTRACT

GaN is grown by creating a Ga vapor from a powder, and using an inert purge gas from a source to transport the vapor to a growth site where the GaN growth takes place. In one embodiment, the inert gas is $N_2$, and the powder source is GaN powder that is loaded into source chambers. The GaN powder is congruently evaporated into Ga and $N_2$ vapors at temperatures between approximately 1000 and 1200° C. The formation of Ga liquid in the powder is suppressed by the purging of an inert gas through the powder. The poser may also be isolated from a nitride containing gas provided at the growth cite. In one embodiment, the inert gas is flowed through the powder.

32 Claims, 14 Drawing Sheets

GAN BULK GROWTH BY GA VAPOR TRANSPORT

RELATED APPLICATIONS

This application is a Continuation Under 35 U.S.C. §1.111(a) of International Application No. PCT/US2005/011770, filed Apr. 4, 2005 and published in English as WO 2005/111279 on Nov. 24, 2005, which claims priority to U.S. Provisional Application Ser. No. 60/559,196 (entitled GaN Bulk Growth by Ga Vapor Transport, filed Apr. 2, 2004) which is incorporated herein by reference.

FIELD OF THE INVENTION

The field of the invention relates to semiconductor materials, specially the realization of boules or thick films of single crystal Gallium Nitride.

BACKGROUND OF THE INVENTION

GaN is one of the most interesting semiconductor materials that is useful for fabrication of laser diodes [LD], light emitting diodes [LED] and high power, high frequency electronic devices. But, due to the severe shortage of GaN substrates, these devices are fabricated on foreign substrates such as SiC, Sapphire, $LiGaO_2$ or $LiGaO_3$. Hence, they are suffering from high dislocation density and bending caused by lattice mismatch and thermal expansion coefficient mismatch respectively between GaN and substrate. In order to improve the performance of devices such as LDs, LEDs and high electron mobility transistors (HEMTs), homoepitaxial device layers grown on high quality free standing GaN substrates are very important.

GaN nitride materials are finding many applications such as microwave electronics, electro-optics and power electronics. In addition many of the unique properties of GaN such as wide bandgap (leading to violet and ultraviolet LED's and lasers) as well as large spontaneous polarization are being exploited for new and novel devices. In order to continue and speed the development of this technology bulk substrates are desired. Bulk substrates will allow the realization of high device efficiencies lower leakage currents and longer device lifetimes.

Several efforts are underway to produce freestanding GaN substrates. Growth rate of GaN layers obtained by conventional methods such as MOCVD or MBE is very low and is not suitable for producing bulk GaN single crystals. In the recent past, Hydride Vapor Phase Epitaxy, High Nitrogen Pressure Solution Growth, and Sublimation Techniques are being used to grow bulk GaN crystals. Free standing GaN crystals are also prepared by reaction of Ga vapors with ammonia, Ga with Ammonia, sublimation of GaN powder and growth in sodium flux.

Initial development of GaN devices has utilized foreign substrates and hetero-epitaxy. These substrates include sapphire, ZnO, $LiGaO_2$, LiAlO and silicon carbide. Devices fabricated from hetero-epitaxial materials suffer from problems relating to dislocations, domains and grain boundaries. In additions problems of cracking relating to thermal mismatches in the materials are evident. In order to ameliorate the problems several patents have been filed relating to techniques of substrate removal and hetro-epitaxal growth which are designed to reduce these problems.

In order to completely eliminate these problems a single crystal boule of GaN is required. One technique, GaN is grown from a liquid held at high pressure. This technique produces high quality platelets of GaN but results in a very low growth rate and utilizes expensive high pressure growth technology which is not easily scaled up.

There have been several techniques which utilize Hydride Vapor Phase Epitaxy (HVPE) or Metallo Organic Chemical Vapor Deposition (MOCVD) technology to produce bulk films. These techniques employ Ga transport via GaCl or a Ga containing metal organic compound. The MOCVD based techniques have not demonstrated high growth rates. The HVPE based techniques show relatively high growth rate but are limited in substrate temperature due to the details of Cl based transport. In addition these HVPE techniques suffer from significant loss of growth species due to wall depositions There are also methods in which GaN is grown from Ga vapor. These methods utilize Ga obtained from sources held at high temperatures in the presence of ammonia. In these methods it is not possible to stabilize or control the Ga vapor. The substrate temperature is maintained lower than the vapor source.

Growth of bulk GaN has been demonstrated using liquid phase based techniques. High growth temperatures and pressure (10-20 kilobars) are employed in an attempt to overcome an extremely low solubility of nitrogen in melts in general and Ga melts in particular. Despite the high pressures, nitrogen solubility is still low and growth rates no greater than 0.01-0.05 mm/hr can be obtained. In addition to the low growth rates this production process is very difficult to implement due to the high pressures. Similar problems of solubility are seen in flux based systems in which additives are used to increase the nitrogen solubility in the melt. Amonothermal growth which uses super critical ammonium (similar to the process for the production of single crystal quartz) suffers from even lower growth rates and also has not proven to be commercially feasible.

All of the competitive bulk growth technologies for WBG semiconductors are vapor based. In the case of GaN there have been several techniques which utilize HVPE or MOCVD technology to produce bulk films. These techniques employ Ga transport via GaCl or a Ga containing metal organic compound. The MOCVD based techniques have not demonstrated high growth rates. More promising are the HVPE based techniques which show relatively high growth rates (the best reported are 200 um/hr) but are limited in substrate temperature due to the details of Cl based transport. Prior art FIG. 1 shows values of the growth rates as well as the results of simulations of GaN growth in a prior chloride transport system as a function of substrate temperature. The growth rate is almost constant in the temperature range (T=1050-1100° C.) and dramatically drops down at higher temperatures due to etching of GaN by HCl and $H_2$. In addition these HVPE techniques suffer from significant loss of growth species due to wall depositions.

There have been several studies related to the growth of GaN from Ga vapor. In some prior attempts, growth rates of 1 mm/hr have been demonstrated, but it was not possible to stabilize the growth over long periods of time.

SUMMARY OF THE INVENTION

Bulk GaN is grown utilizing vapor transport. By utilizing unique vaporization properties of GaN in various geometries, a stable source of Ga is obtained in a vapor stream. A high supersaturated Ga vapor and subsequent injection Ga in conjunction with a nitride source, such as ammonia is used to produce thick films or boules of GaN at high growth rates.

GaN is grown by creating a Ga vapor from a powder, and using an inert gas from a source to transport the vapor to a site where the GaN growth takes place. In one embodiment, the inert gas is $N_2$, and the powder source is GaN powder that is loaded into source chambers. The GaN powder is congruently evaporated into Ga and $N_2$ vapors at temperatures between approximately 1000 and 1150° C. The formation of Ga liquid in the powder is suppressed by the purging of $N_2$ through the powder.

The resulting Ga vapor is transported and injected and mixed with a nitride source, such as ammonia supplied at an inlet. By separating the generation of the Ga vapor from the growth site, the powder may be held at a temperature approximately 50-200 degrees below a seed temperature at the growth site. Since the source of Ga is a congruent decomposition of GaN, the amount of Ga in the vapor phase can be adjusted by changing a length of an $N_2$ source crucible, the flow rate of the $N_2$ purge gas, the temperature of the powder and the operating system pressure. The flow of ammonia as well as the partial pressure of ammonia is adjusted by mixing with $N_2$ in the ammonia inlet stream.

DETAILED DESCRIPTION OF THE INVENTION

Figure 1:
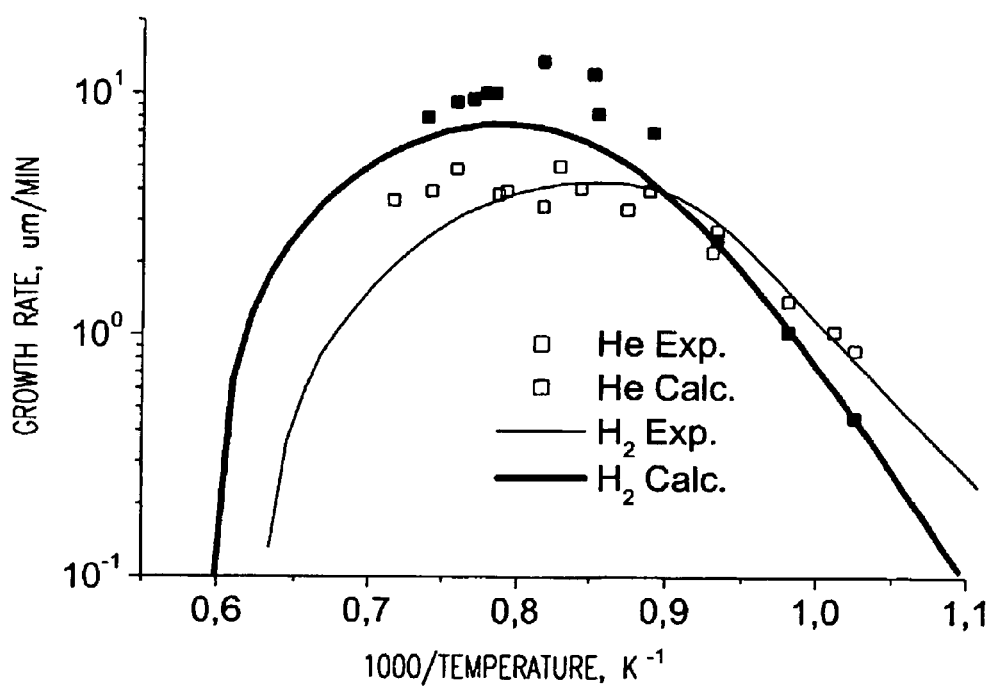
FIG. 1 is a prior art graph showing prior growth of GaN HVPE as a function of temperature.

In the following description, reference is made to the accompanying drawings that form a part hereof, and in which is shown by way of illustration specific embodiments in which the invention may be practiced. These embodiments are described in sufficient detail to enable those skilled in the art to practice the invention, and it is to be understood that other embodiments may be utilized and that structural and logical changes may be made without departing from the scope of the present invention. The following description is, therefore, not to be taken in a limited sense, and the scope of the present invention is defined by the appended claims. Figures showing results are just typical examples of results that were obtained using the methods and devices described herein. Different results may be obtained with different implementations.

In one embodiment, stable growth rates are obtained while growing GaN from Ga vapor. A powder source of GaN is used to create Ga vapor. The size of powder particles ranges from approximately 1 to 100 microns in one embodiment. Larger and smaller sizes of particles may be used in further embodiments. The source powder may contain selected dopants in further embodiments to obtain doped boules of GaN with desired semiconductor properties. The powder is purged with an inert gas, such as N2, which is also used to carry the Ga vapor to a growth cite, where it is combined with a nitride source, such as ammonia to grow GaN films or boules. Other nitride sources may include at least hydrazine, hydrazoic acid, and azides. Instability was found to result from the use of liquid Ga sources or the effects of $H_2$ or $NH_3$ in the source region. In contrast to HVPE techniques in a boule growth technique which utilizes Ga vapor as opposed to GaCl vapor, much higher growth temperatures are possible.

The vaporization of GaN is believed dominated by a kinetic barrier. Unlike most materials this barrier is extremely large. For example it has been found that GaN evaporates congruently and the vapor pressure of Ga and nitrogen evolving from the free surface is 0.35 Pa at 1150° C. This is quite different from the equilibrium condition where the nitrogen pressure is over 1000 Pa. The evaporation flux of Ga from a free surface is dramatically different than the flux of Ga from a powder source. This difference is due to the increased surface area of the GaN powder. If GaN is evaporated from a cylinder of area S and height H and volume V the evaporating flux will be multiplied by a factor $(1-p)/r_g$ where p is the porosity and $r_g$ is the radius of the individual grains (for a 1 um grain radius and 80% porosity this factor is $0.2 \times 10^4$). A consideration in the evaporation of GaN powder is the equilibrium vapor pressure of Ga over liquid Ga. Depending on the grain size of the powder this pressure could be exceeded and it could become thermodynamically favorable for liquid Ga to form on the GaN grains. If Ga liquid forms, the decomposition reaction is catalyzed, and the decomposition barrier is significantly lowered.

To avoid the decomposition reaction, GaN powder is separated from the ammonia environment where growth takes place. Nitrogen is used to purge the powder and transport the Ga vapor. Because the powder is exposed to primarily a nitrogen environment the kinetic barrier for decomposition is maintained. If $H_2$ or $NH_3$ are present in some significant amounts, the GaN powder may be significantly etched with the resulting formation of Ga liquid and enhanced decomposition.

Figure 2:
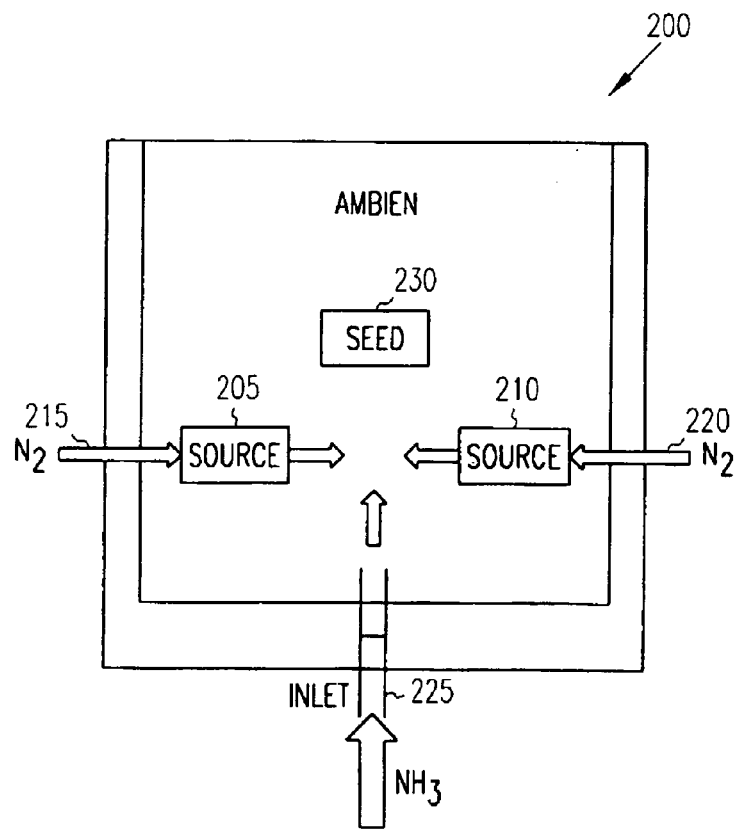
FIG. 2 is a block schematic diagram of growth of GaN from Ga vapor according to an example embodiment.

FIG. 2 is a schematic diagram illustrating generally at 200, growth of GaN from Ga vapor. GaN powder is loaded into source chambers 205 and 210. One or more such chambers may be used. GaN is congruently evaporated into Ga and $N_2$ vapors at temperatures between 1000 and 1150° C. The formation of Ga liquid in the powder is suppressed by the purging of $N_2$ through the powder. The $N_2$ is provided from one or more crucible sources 215, 220. The Ga vapor is transported as indicated by the arrows and injected and mixed with ammonia supplied at an inlet 225. This configuration allows the powder to be held at a temperature 50-200 degrees below a seed 230 temperature. The seed may be held by a graphite fixture, also represented by reference number 230. Other suitable materials may be used for the fixture as well. Since the source of Ga is the congruent decomposition of GaN, the amount of Ga in the vapor phase can be adjusted by changing the length of the $N_2$ source crucible, the flow rate of the $N_2$ purge gas, the temperature of the powder and the operating system pressure. The flow of ammonia as well as the partial pressure of ammonia is adjusted by mixing with $N_2$ in the inlet 225 stream.

Figure 3:
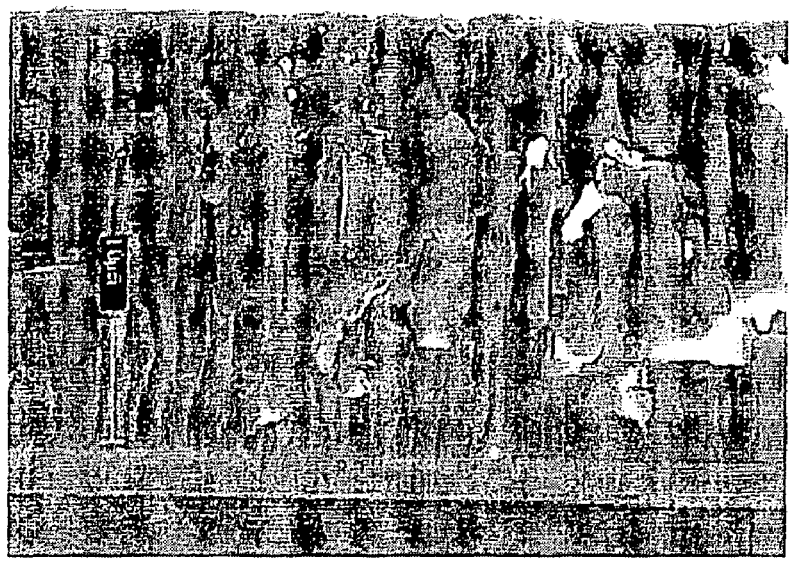
FIG. 3 is a cross sectional micrograph of GaN grown by Ga vapor transport on a preexisting epitaxial layer of GaN according to an example embodiment.

A cross section of material grown using this technique is shown in FIG. 3. FIG. 3 is a cross sectional optical micrograph of GaN grown by Ga vapor transport on an epitaxial layer of GaN that was grown by HVPE. During the vapor transport growth, a total thickness of 35 um was obtained in 15 minutes. The starting substrate was a 3-6 um epitaxial layer of GaN grown by HVPE. The starting substrate is easily seen in the optical micrograph due to the difference in reflectivity of the starting layer and the subsequent growth.

Figure 4:
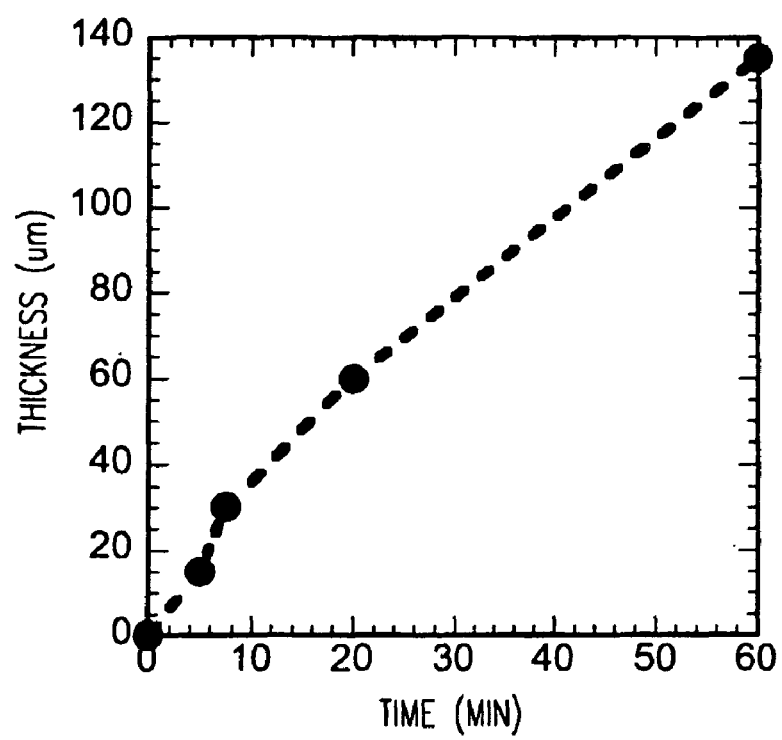
FIG. 4 is a graph showing thickness of GaN films grown by Ga vapor transport as a function of time according to an example embodiment.

FIG. 4 shows the average thickness of GaN films grown by Ga vapor transport as a function of time (growth conditions other than time held constant) as a function of the growth time. This data corresponds to an average growth rate as high as 180 um/hr. From the data shown in FIG. 5 it is obvious that the growth rate of GaN is changing dynamically.

Figure 5:
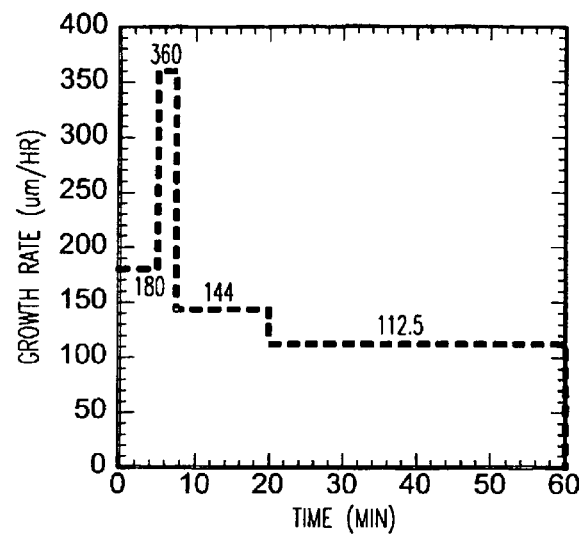
FIG. 5 is a graph showing differential growth rate of GaN as a function of time according to an example embodiment.

The differential growth rate as a function of time is shown in FIG. 5, with all growth conditions except time being held constant. It can be seen that the differential growth rate is measured as high as 360 um/hr. The low growth rate at short times may be due to Ga rich conditions while the growth at long time is low, likely due to depletion of Ga from the powder. The Ga rich conditions support the formation of adducts in the gas phase removing Ga from the system as GaN, while the Ga deficit conditions are responsible for the low growth rate.

A method for making single crystal GaN comprises: a disposing step of a gas containing Ga at temperature $T_1$; a GaN powder evaporation step which produces a Ga vapor by congruent evaporation; a nitrogen purging step through the Ga powder which prevents the formation of a second phase (liquid Ga) in the powder and provides controlled transport of the Ga vapor to the seed as well as controlled partial pressure of the Ga vapor; a disposing step of ammonia, molecular nitrogen and hydrogen in temperature area $T_2$; and a disposing step of hydrogen in temperature area $T_2$ to prevent the formation of GaN particles in the gas phase.

The above method of making a GaN single crystal, wherein: a graphite fixture holds the powder source at a temperature 50-200 degrees below the seed temperature; the Ga containing gas and the ammonia (nitrogen containing gas) and the hydrogen containing gas are mixed in close proximity to the GaN seed; and a single crystal-forming step causing said GaN-forming gas to reach said single crystal so as to form said GaN single crystal In one embodiment, GaN is grown by transporting Ga vapor that is obtained from decomposing GaN powder to the seed. This process is different from sublimation in the sense that it is a combination of sublimation and chemical vapor transport rather than sublimation alone. Apart from "subliming" the powder, since the Ga vapor is transported toward the seed, this process is referred to as Sublimated Vapor Transport [SVT]. It is demonstrated that GaN powder provides a stable source of Ga.

Figure 6:
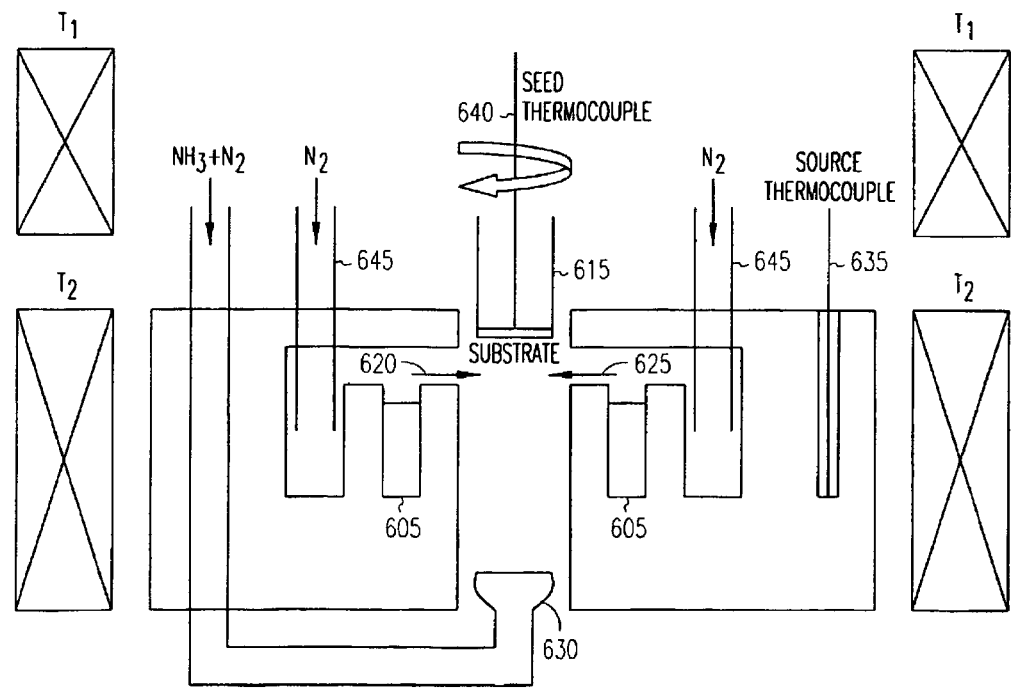
FIG. 6 is a schematic diagram illustrating an alternative device for growth of GaN from Ga vapor according to an example embodiment.

Experimental procedure:
Raw materials used in the experiments:
99.99% pure GaN powder manufactured by Alfa Aesar.
99.999 Ammonia from Airgas.
99.999 Nitrogen from Airgas.
GaN epi [3-6µ thick] on Sapphire wafers purchased from TDI Inc. unintentionally doped to a level of $1\times10^{16}$-$1\times10^{17}$ cm$^{-3}$ GaN epi on Sapphire seeds of 8.5 mm×8.5 mm size are diced from 2" wafers purchased from TDI Inc. Bulk GaN samples of 8.5 mm×8.5 mm size are grown in a 4 zone vertical resistive heating furnace. The GaN powder and ammonia are used as the source of Ga and N respectively for bulk GaN growth. A schematic of a device used to grow GaN crystal is shown in FIG. 6. It consists of a boat 605 that contains the GaN powder and a seed holder 615. A Ga vapor that is sublimed from GaN powder is transported as indicated by arrows 620, 625 by Nitrogen gas towards a seed in seed holder 615 where it reacts with Ammonia gas that comes from the bottom as shown at 630. The surfaces of the substrates are cleaned in methanol to get rid of any dust particles on the surface.

The boat 605 is an annular boat is made up of hot pressed Boron Nitride in one embodiment. A groove deep enough to hold the source material is machined into the BN boat as shown. This boat is suspended from a top of a flange by means of three stainless steel rods (not shown). The seed holder rod (not shown) enters the configuration from the top and the position of the seed may be adjusted by means of a thread arrangement. Hence the distance between the source and the seed could be adjusted by adjusting the seed holder.

The whole assembly is enclosed within a graphite ampoule coated with SiC in order to protect the furnace elements from reacting with the process gases. This coating of SiC prevents etching of graphite by the hydrogen produced from the cracking of ammonia. A hole may be drilled into the circumference of the BN boat to hold a thermocouple 635 that measures the temperature of source GaN powder. The seed holder is made up of hot pressed BN and is attached to the bottom end of the Molybdenum seed holder tube. A seed holder rod 640 is driven by a motor and has the ability to rotate at desired speeds. In one embodiment, the seed holder is rotated at approximately 5 rpms. The rotation speed may be varied significantly in further embodiments. The temperature of the seed is measured using a thermocouple that goes through the seed holder rod.

From the schematic, it can be seen that there are two different flows directed toward the seed. A side flow from inlets 645 consists of Nitrogen and it carries the Ga vapor that is obtained from the decomposition of GaN powder. The second flow that is a mixture of ammonia and nitrogen comes from the bottom and is directed vertically upwards towards the substrate. Initially 5 grams of GaN powder is weighed and filled into a groove to the brim in the BN boat 630 as shown in FIG. 6. The commercially available GaN powder is yellow in color. The distance between the seed and the source boat 630 is kept at a constant value of 3 mm. The temperature of the source has been varied from 1000° C. to 1155° C. The side flow was varied from 320 sccm to 600 sccm. The ammonia flow was varied from 10 sccm to 40 sccm keeping the total bottom flow was kept constant at 100 sccm.

Figure 7:
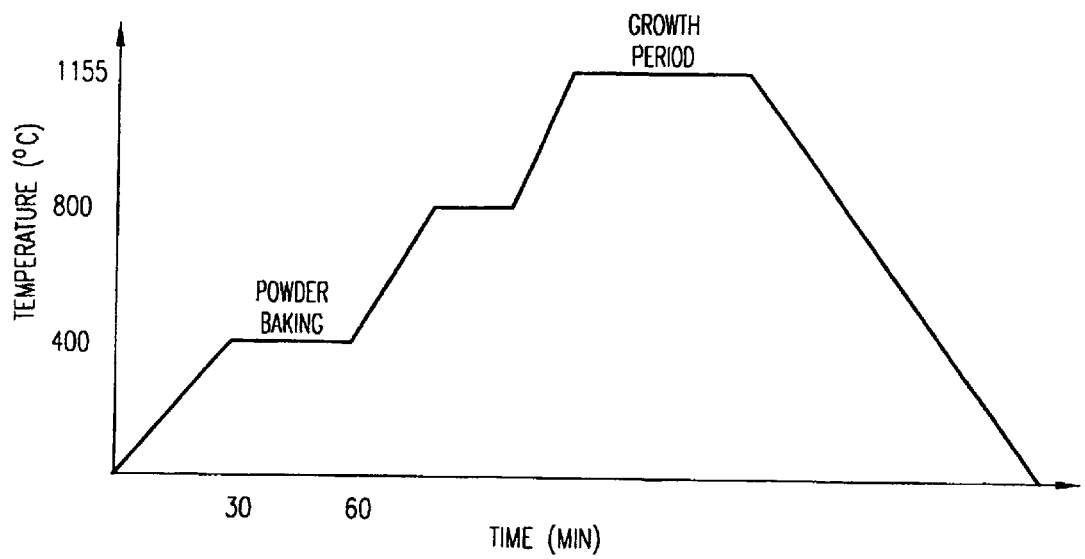
FIG. 7 is a graph of temperature versus time for one growth process according to an example embodiment.

A typical growth process flow is shown in FIG. 7. At the beginning of the process, the system is pumped down to <1 mTorr and back filled to growth pressure [600 Torr] with either nitrogen or argon. Then the temperature of the system is raised slowly to 400° C. and maintained there for 30 minutes to account for any outgassing from the powder as well as the system. Once the foreline pressure is down below $10^{-2}$ Torr, the temperature of the system is ramped up again and stabilized once again at 800° C. for 30 more minutes. At this point, the side nitrogen flow is introduced. This is followed by a final ramping of temperature to growth temperature [1155° C.]. Once the system reaches the growth temperature, the bottom flow is introduced. At the end of growth, the power to the heating coils is turned down and the bottom flow is turned off.

As grown GaN layers were characterized using the following apparatus.

LEICA 440 SEM. Scintag, Inc. Theta-Theta Diffractometer with Cu $K_\alpha$ ($\lambda$=1.5405 A°) radiation. Philips High Resolution Diffractometer. ThermoMicroscopes AFM. Dilor XY 800 confocal Raman spectrometer. The excitation wavelength 514.5 nm with a CW argon ion laser. Hall effect measurements.

In order to make sure that GaN powder acts as a stable source of Ga vapor for crystal growth experiments, GaN powder decomposition experiments may be routinely performed in different atmospheres at different temperatures. If GaN powder is used instead of a wafer of the same weight, number of Ga atoms produced per second from the powder will be a factor of $(1-\rho)/r$ more than that of wafer decomposition due to higher surface area of the powder. $\rho$ is the porosity of the powder and r is the radius of the GaN granule respectively in the above expression. This principle is used to increase incoming Ga flux and hence increase the growth rate of GaN.

The source powder may be weighed before and after the experiment to determine the weight loss. After the growth run the color of the top layer of the source powder is changed from yellow to dark grayish color especially in the portions closer to nitrogen inlet 645. Beneath this top layer, the powder changed its color from yellow before growth run to pale yellow after the run. Ghe dark grayish powder may be non-stoichiometric Ga rich GaN.

Figure 8:
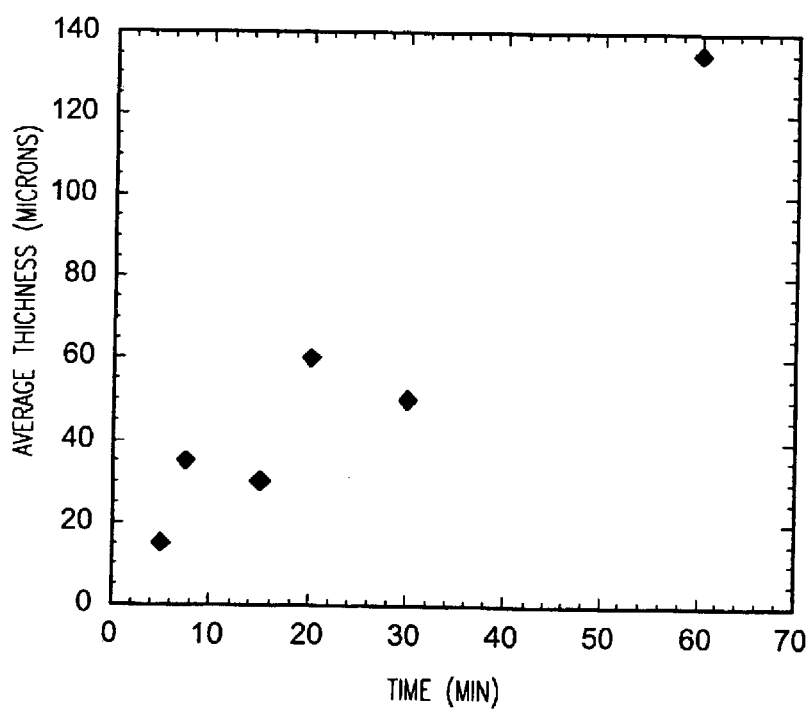
FIG. 8 is a plot of average thickness of growth versus growth time for an example embodiment.

Crystal growth experiments may be performed for different time periods to obtain the variation of growth rate with respect to time. FIG. 8 shows the variation of weight loss from GaN powder with respect to time. These growth runs were performed at a source temperature of 1155° C., seed temperature of 1185° C. side flow of 450 sccm [$N_2$] and a bottom flow of 100 seem [90 sccm $N_2$+10 sccm $NH_3$]. It can be observed from the plot that weight loss [denoted by black diamonds] increases linearly with time for shorter growth runs. But, the rate at which the source looses weight becomes low at longer times. This indicates that the source GaN powder is getting depleted of Gallium as the growth progresses. The seed holder is not rotated in some embodiments. This results in a linearly varying thickness profile of the growth layer, the layer being thicker on the portion of the seed that is closer to side nitrogen flow inlet. Rotation of the seed holder may be used to provide a more uniform thickness. The speed of rotation is related to the growth rate, and may be determined empirically.

Figure 9:
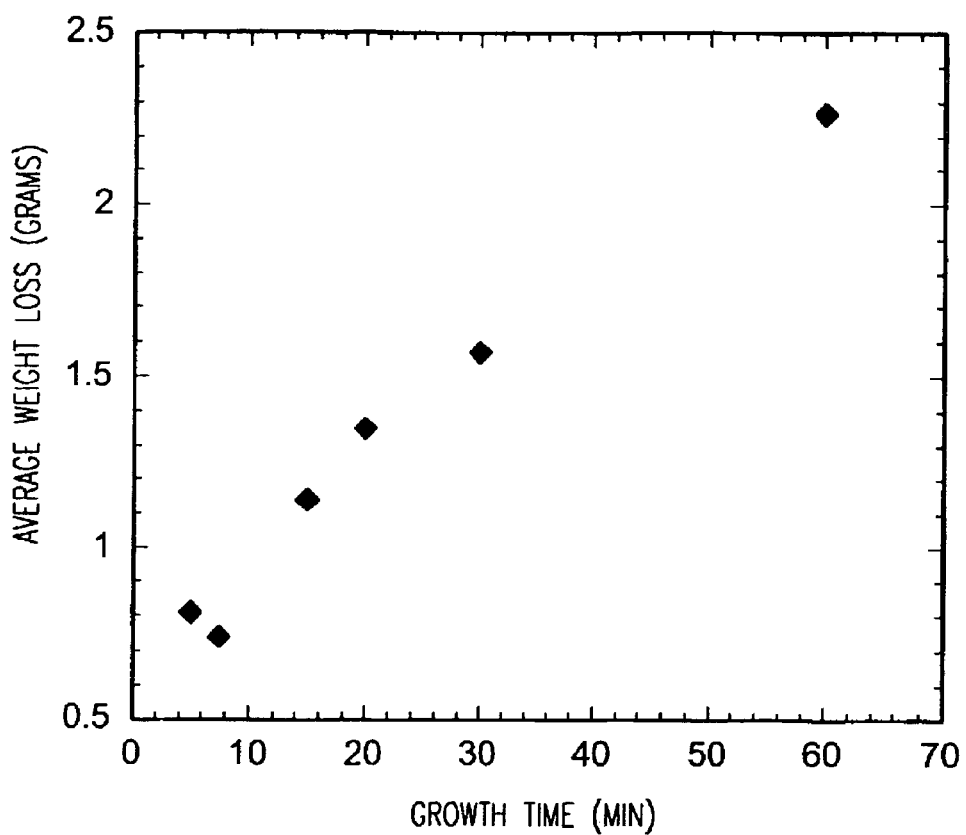
FIG. 9 is a plot of average weight loss of a source powder versus time for an example embodiment.
Figure 10:
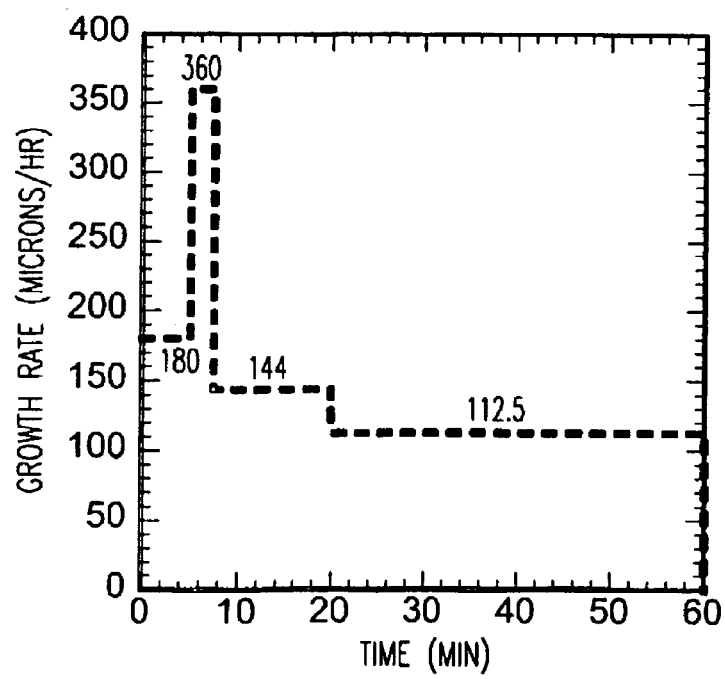
FIG. 10 is a plot of differential growth rate versus time for an example embodiment.

Average thickness of the growth layer is defined as the algebric mean of thicknesses measured at both ends of the substrate. Average thickness of the growth layer [denoted by black diamonds] variation with time follows the same variation as the weight loss as shown in FIG. 9. The differential growth rate that is the slope of curve in FIG. 9 is shown in FIG. 10. It is observed that a maximum growth rate of 360 microns/hr was obtained between 5 min and 7.5 min.

Figure 11:
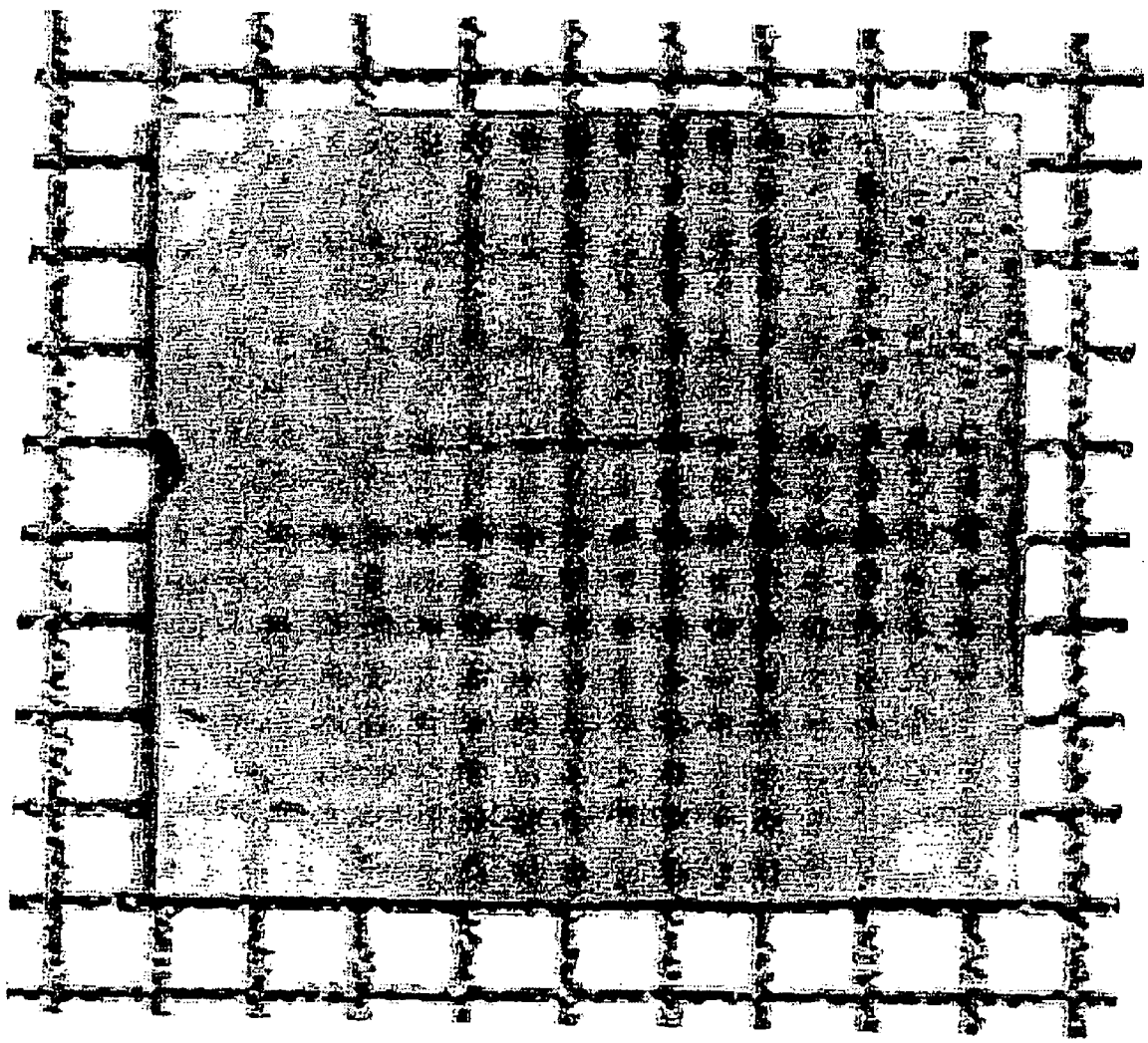
FIG. 11 is an image of a typical growth sample according to an example embodiment.

A Nomarski optical microscope image of a typical growth sample is shown in FIG. 11. Each division in the background corresponds to 1 mm. The circular deposition corresponds to the GaN layer that was grown in accordance with the present invention. Since the seed holder enclosed the corners of the substrate, there is no deposition on the corners of the seed crystal.

Figure 12A:
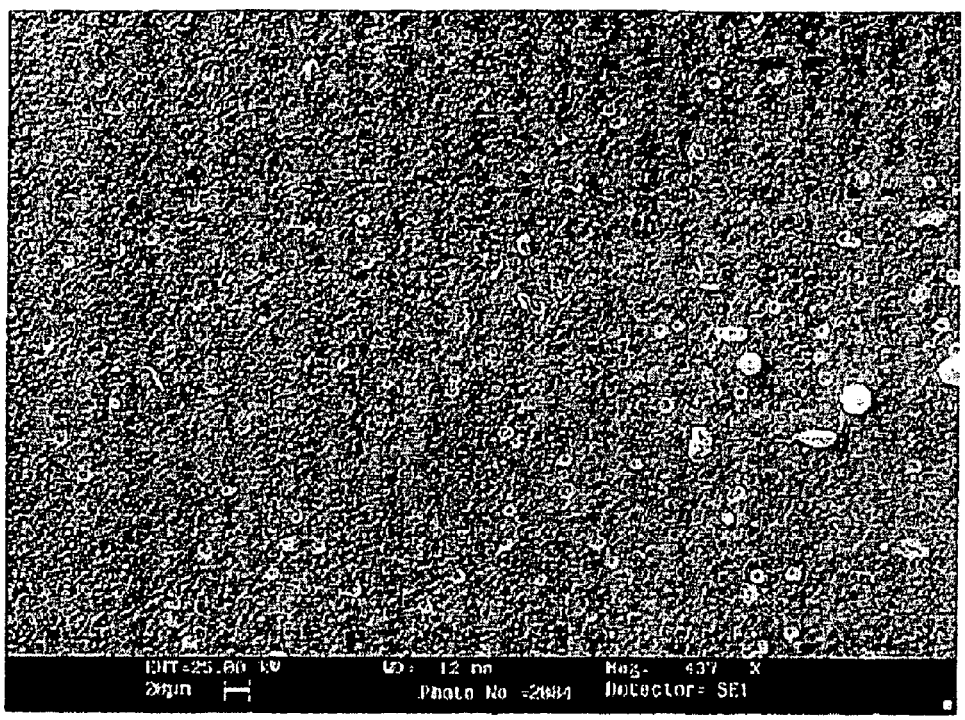
FIGS. 12A and 12B are cross section and surface views of a layer of GaN crystal grown in one example embodiment.
Figure 12B:
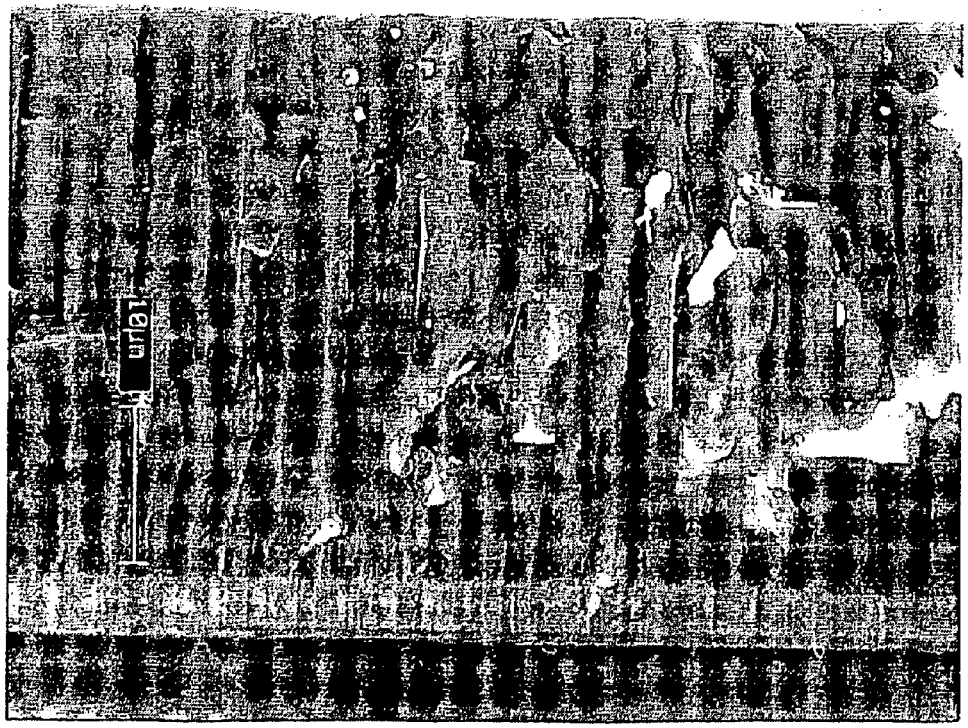

FIGS. 12A and 12B show the cross section view and the surface view of the layer that was grown at a seed temperature of 1185° C., a source temperature of 1155° C. with a sideflow of 450 sccm and a bottom flow of 100 sccm that is comprised of 10 sccm of ammonia and 90 sccm of nitrogen. Surface view shows number of hexagonal V-defects as well as particles on the surface in a few cases.

Figure 13A:
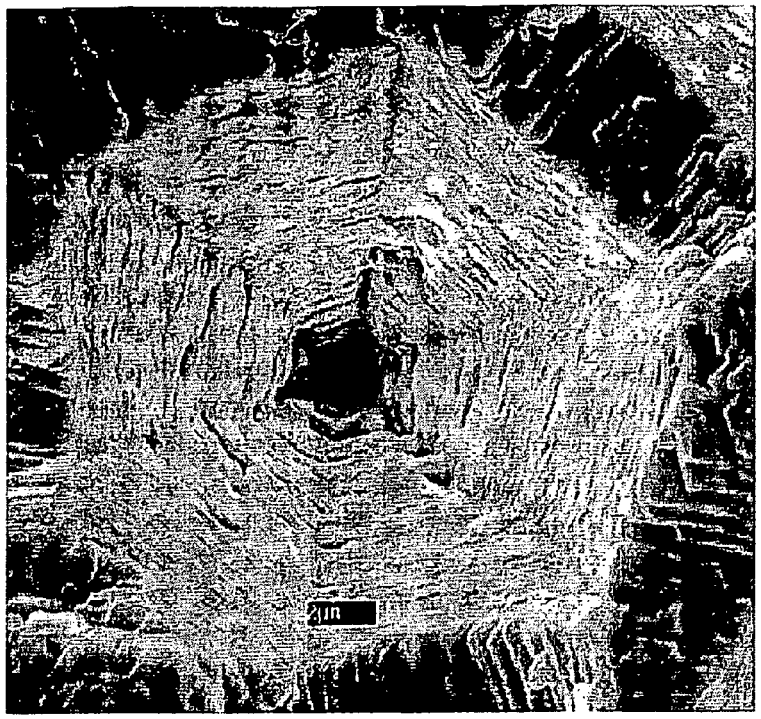
FIGS. 13A and 13B are cross section and surface views of V-defects in one example embodiment.
Figure 13B:
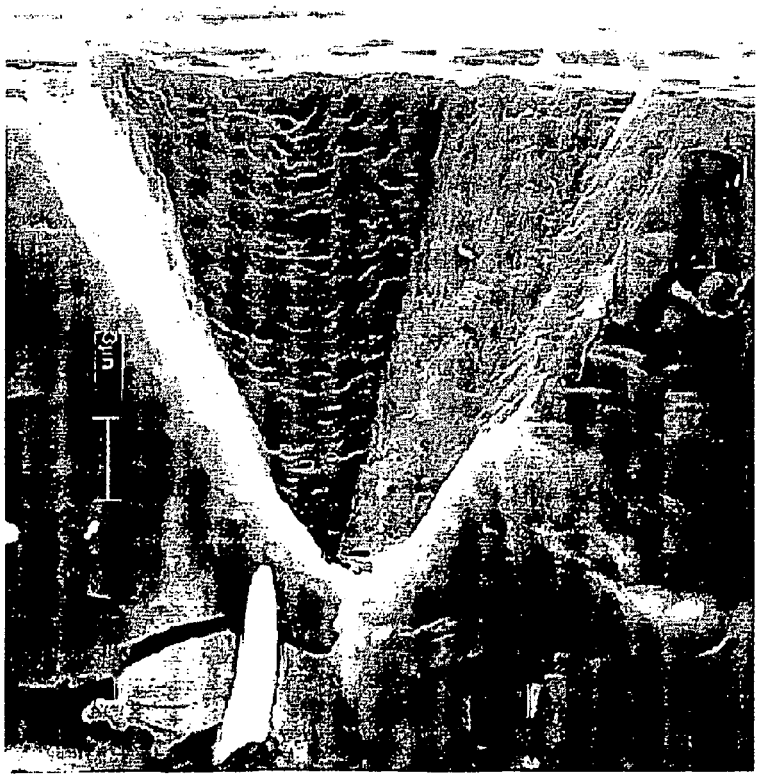
Figure 14:
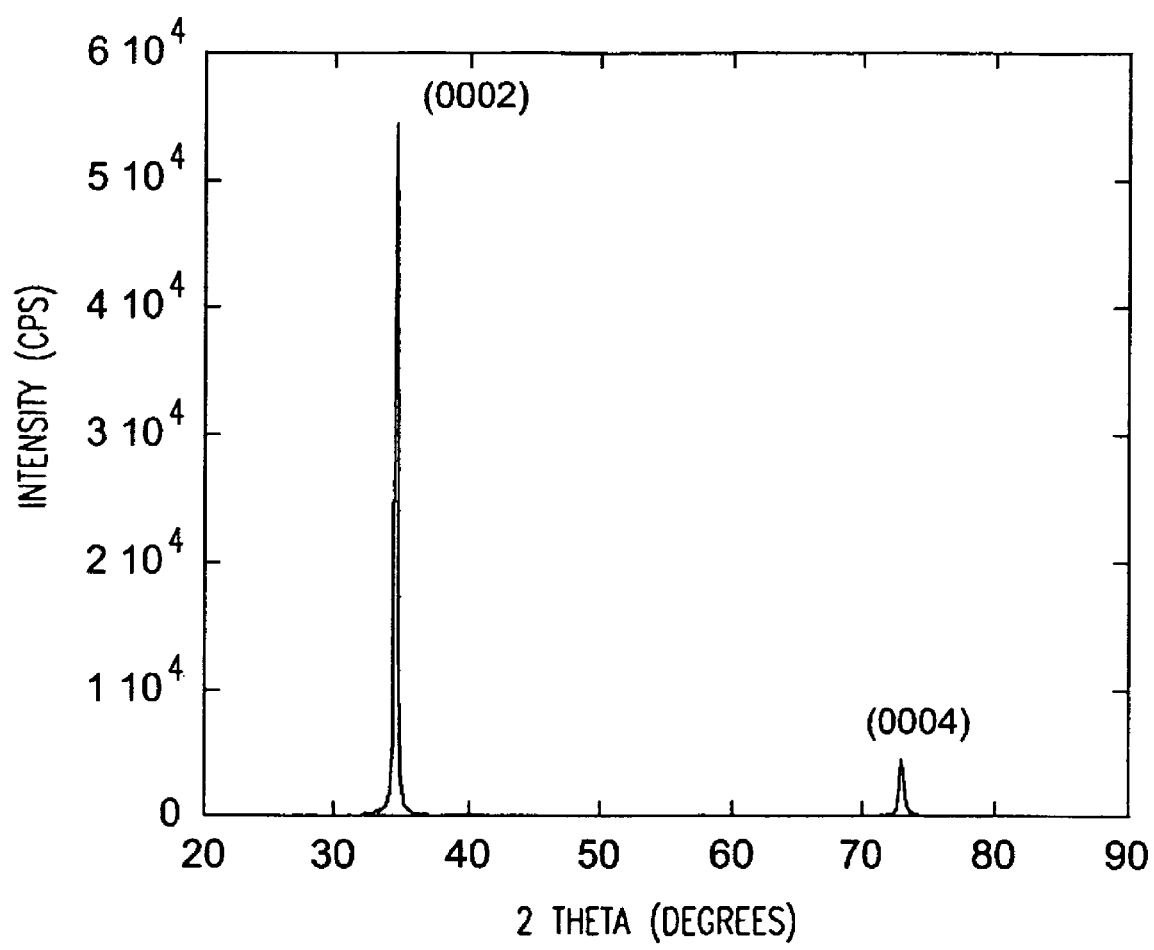
FIG. 14 is a 0-20 scan illustrating single crystal wurtzite GaN grown in an example embodiment.

The top view and cross section of these V-defects are shown in FIGS. 13A and 13B respectively. These V-defects are similar to those that are observed in HVPE GaN and GaN/InGaN system. They are concave hexagonal pyramids that are encircled by six {1-101} facets. The grown GaN layers were studied with X-ray diffraction using Cu $K_{\alpha 1}$ radiation and a monochromator crystal. $\theta$-$2\theta$ scan in FIG. 14 proves that the grown layers are single crystal wurtzite GaN. Sharp peaks corresponding to (0002) and (0004) sets of planes are observed at 34.4° and 72.75° respectively. This particular sample was grown at a source temperature of 1155° C. at a side flow of 450 sccm and a bottom flow of 100 sccm [10 sccm ammonia and 90 sccm of nitrogen].

Figure 15A:
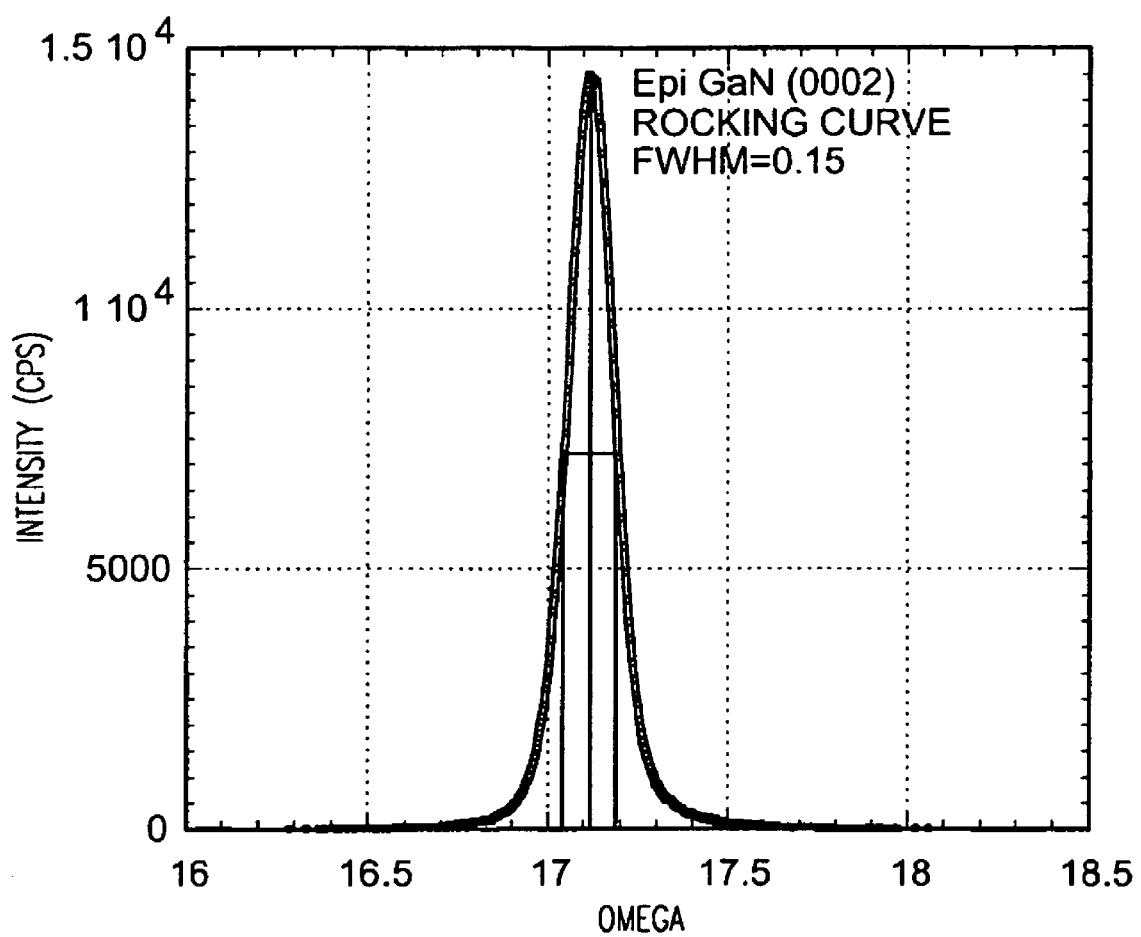
FIGS. 15A and 15B illustrate rocking curves demonstrating crystallographic quality of seed and grown layers in an example embodiment.
Figure 15B:
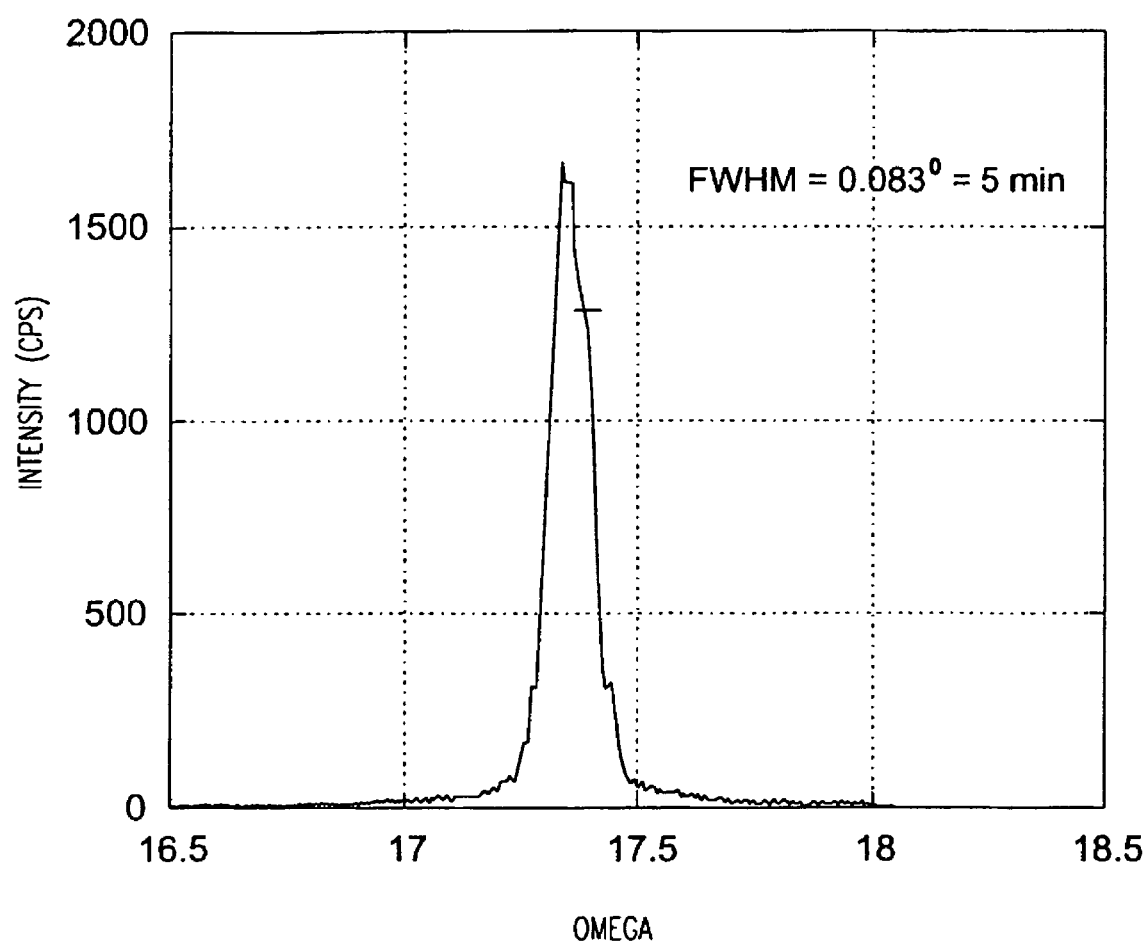

A typical double crystal rocking curve ($\omega$-scan) of the sample is shown in FIGS. 15A and 15B. The figures demonstrate the difference in the crystallographic quality of the seed and the layer that was grown on top of the seed. Rocking curve measurements of the GaN layer reveal the full width at half-maximum (FWHM) of 5 arc min whereas it is 9 arc min for the substrate. This clearly indicates the superior quality of the bulk grown GaN layer compared to that of the substrate.

Figure 16:
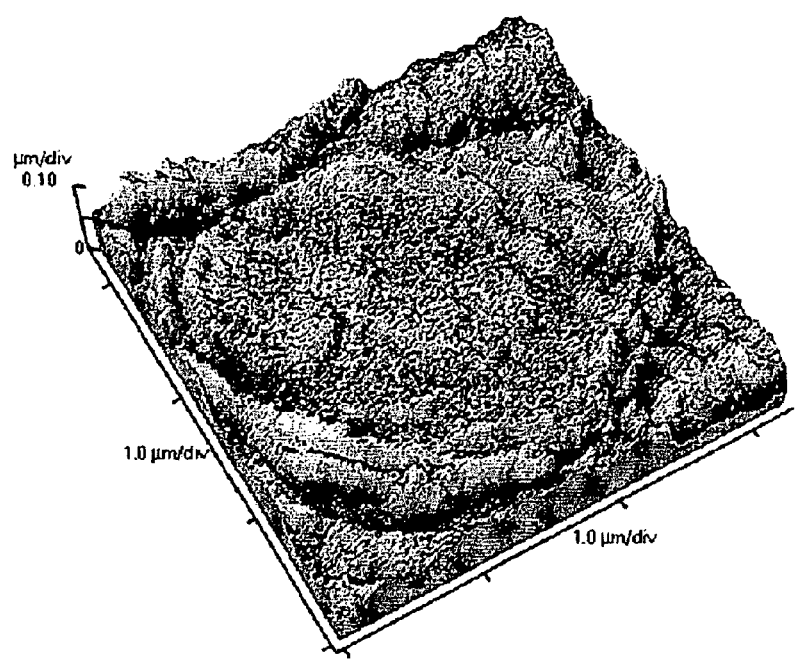
FIG. 16 is an AFM scan of a surface of a grown layer in an example embodiment.

FIG. 16 shows an AFM scan of the surface of the grown layer. The scan area is 3.2×3.2 μm. The growth spiral in the figure shows that the dominant growth mode is dislocation-mediated growth. It could be seen from the figure that the step heights do not correspond to the atomic step height.

Figure 17:
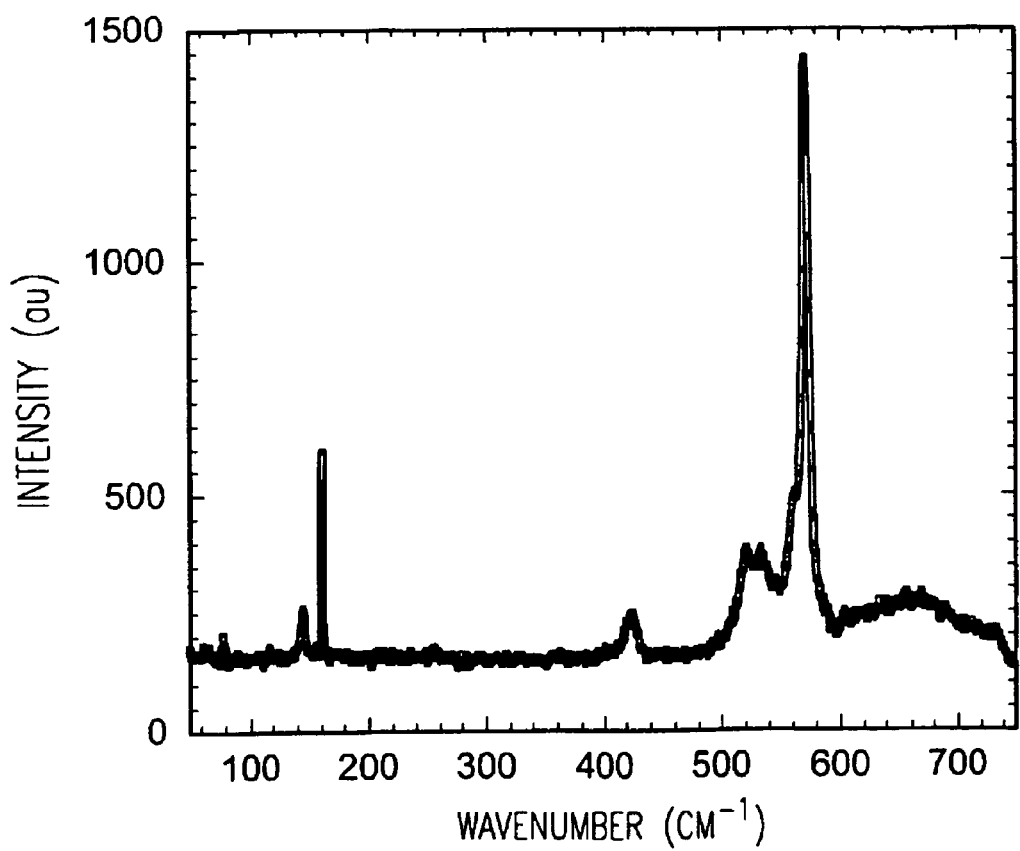
FIG. 17 illustrates a Raman spectrum of a grown layer in an example embodiment.
Figures 18, 19:
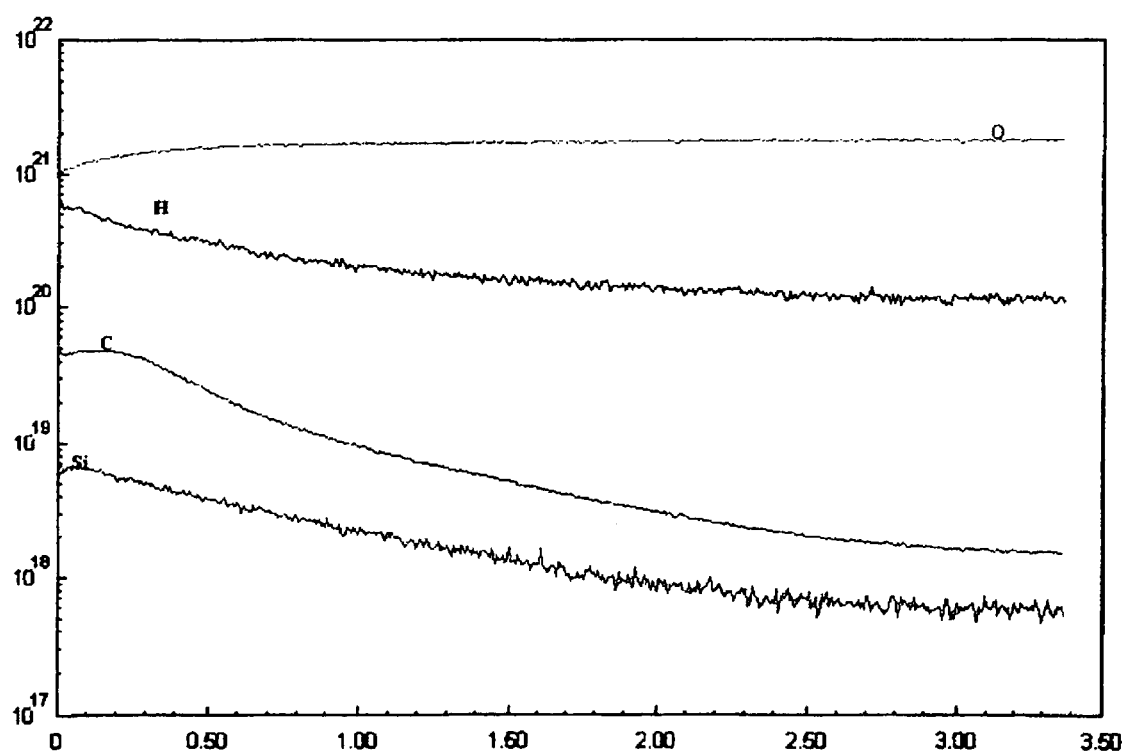
FIG. 18 is a table illustrating a glow discharge mass spectroscopy analysis according to an example embodiment.
FIG. 19 is a graph illustrating a glow discharge mass spectroscopy analysis according to an example embodiment.

Raman spectrum of the grown GaN layer is shown in FIG. 17. Electrical properties of the grown layers were measured by Hall effect measurement technique. Electrical contacts were made using Indium metal and Hall measurements were carried out using van der Pauw technique. From the Hall effect measurement, the layer was found to be n-type with a carrier concentration of $6.67 \times 10^{18}$ cm$^{-3}$ and a mobility of 550 cm$^2$/Vs. This high carrier concentration is attributed to the presence of impurities in the source material. Glow discharge mass spectroscopy analysis of the powder as well as SIMS on the grown GaN layer were performed, and the results were presented in Table 1 in FIG. 18, and FIG. 19 respectively. It can be seen that the high concentration of impurities in the growth layer [0, C, and Si] are from the source material that is the commercially available GaN powder. Hydrogen in the growth layer is originated from the decomposition of ammonia.

During the experiments described above, liquid Ga was not observed in the GaN powder after the crystal growth experiments. It appears from using high purity GaN powder, that oxygen may strongly influence the congruent evaporation of commercially available GaN powder. Among the impurities that are present in the commercial GaN powder, oxygen has the ability to form oxides of gallium that are volatile at reaction temperatures and hence assist in enhanced Gallium transport. This could explain the high Ga transport and hence the high GaN growth rate observed in the experiments performed using commercial GaN powder.

In a simulation, GaN powder decomposition analysis was modeled with oxides of gallium included in the analysis. Simulations were carried out with $N_2$, Ga, GaO and $Ga_2O$ as the species involved, GaN(s) and $Ga_2O_3$ as the condensed phases, and heterogeneous chemistry. The weight losses of the powder source in these experiments were in close agreement with the simulation results when $Ga_2O$ was considered as the evaporating species.

Figure 20:
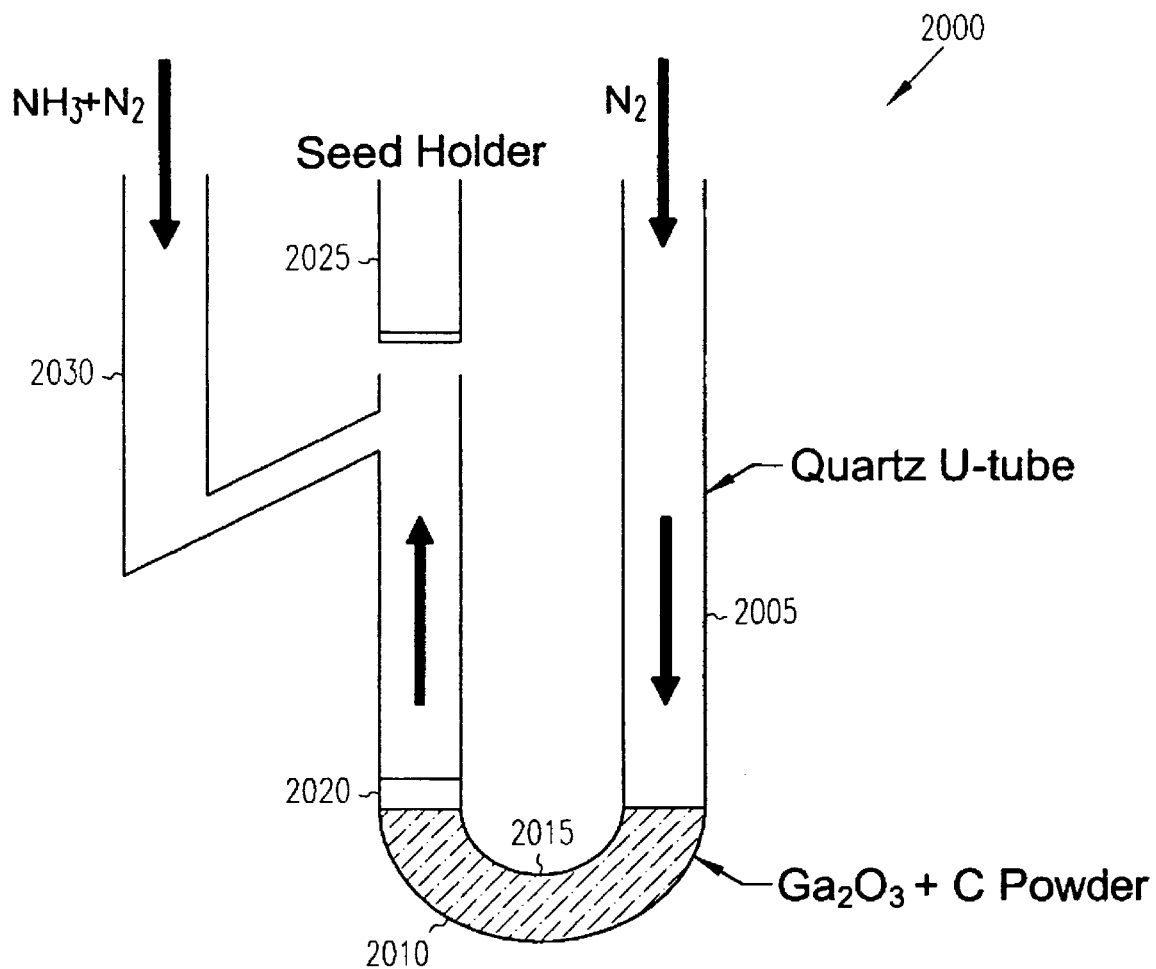
FIG. 20 is a schematic diagram illustrating an alternative device for growth of GaN from Ga vapor according to an example embodiment.

A further alternative embodiment for making GaN single crystal is shown in FIG. 20 generally at 2000. Embodiment 2000 comprises a passage 2005 for an inert carrier gas, such as $N_2$. Passage 2005 is one leg of a quartz U-tube 2010. Other suitable material for tube 2010 may be used. A source powder is disposed in a U shaped portion 2015 of the tube 2010. The carrier gas flows through the source powder, comprising $Ga_2O_3$ plus C powder, and then flows through a porous frit 2020, such as a quartz frit. In one embodiment, the carrier gas purges the powder. A seed holder 2025 is positioned downstream from the powder in a second leg of the tube 2010. A tube 2030 may be coupled to the second leg of the tube 2010 downstream of the powder and upstream of the seed holder 2025. The tube may be used to introduce a nitride containing gas, such as $NH_3+N_2$ between the frit 2020 and seed holder 2025. Other nitride containing gases may also be used. The provision of a nitride source through tube 2030 may further enhance the growth rate and/or crystalline structure. Because the powder is exposed primarily to a nitrogen environment the kinetic barrier for its decomposition is maintained.

Embodiment 2000 may increase the crystal growth rate by increasing the $Ga_2O$ (Gallium sub-oxide) transport efficiency to the growing crystal surface and by flowing carrier gas through the source powder as opposed to flowing it over the powder in previous embodiments. Further the source of $Ga_2O$ in this case is a mixture of $Ga_2O_3$ powder and graphite powder. Other ways of producing $Ga_2O$ species in the vapor phase such as flowing hydrogen or a mixture of hydrogen and nitrogen through the $Ga_2O_3$ powder may also be used. However since hydrogen enhances the decomposition of GaN, using hydrogen to produce $Ga_2O$ may affect the growth rate of GaN.

In an initial set of experiments performed with a seed temperature of approximately 1155° C. and source temperature of 1055° C., GaN growth rates of ~50 microns/hr were observed. X-ray diffraction studies indicated that the grown layers were single crystals. The growth parameters may be modified from the above to vary the growth rate. In one embodiment, the nitrogen carrier gas flow may be set at 400 sccm and the total flow through the ammonia tube may be set at 100 sccm, out of which 50 sccm is ammonia and the rest nitrogen. Growth experiments performed at a higher seed temperature [1200° C.] and higher source temperature [1130° C.] resulted in higher growth rates with thickest portions of the sample indicating a growth rate of 100 microns/hr.

While a U shaped tube was used, other arrangements of tubes or pipes may be used to suitable isolate the source powder from the nitride containing gas. A straight tube may be used, with an addition frit positioned below the powder to support the powder, yet still allow an inert gas to flow through the powder. Other arrangements will be apparent to those skilled in the art.

CONCLUSION

Good quality bulk GaN crystals of 8.5 mm×8.5 mm may be prepared by transporting Ga vapor obtained from the decomposition of GaN powder. Growth rates >200 microns/hr may be achieved using this technique. AFM image of the growth layer shows that the growth mode is dislocation mediated spiral growth. Double crystal X-ray diffraction rocking curve FWHM of the grown layer was found to be smaller than that of the substrate indicating the higher quality of growth layers compared to the substrate. SEM images show V-defects on the surface. Hall Effect measurements, and SIMS show very high impurity levels that can be attributed to the highly contaminated source GaN powder. This was further supported by GDMS of the source GaN powder.

In one embodiment, a carrier gas flows through the source powder, and a nitride containing gas is added downstream from the powder prior to the seed. The powder temperature may be maintained 50 to 200° C. lower than the seed temperature to facilitate desired crystalline growth.

The invention claimed is:

1. A method of growing GaN, the method comprising:
generating a Ga vapor from a GaN containing powder while flowing $N_2$ through the GaN containing powder;
transporting the Ga vapor to a growth site;
providing nitride containing gas to the growth site to facilitate growth of GaN with a desired crystalline structure; and
isolating the GaN powder from the nitride containing gas.

2. The method of claim 1 wherein the GaN powder is kept at a temperature that is different than the temperature of the growth site and the inert gas comprises $N_2$.

3. The method of claim 2 wherein the temperature of the growth site is approximately 50 to 200° C. above the temperature of the GaN powder.

4. The method of claim 1 wherein the growth site is maintained at a temperatures between approximately 1000 and 1200° C.

5. The method of claim 1 wherein the GaN powder contains a dopant.

6. The method of claim 1 wherein the nitride containing gas comprises ammonia.

7. A method of growing GaN, the method comprising:
generating a Ga vapor from a Ga containing powder while flowing $N_2$ through the GaN containing powder;
transporting the Ga vapor to a growth site;
providing a nitride containing gas to the growth site to facilitate growth of GaN with a desired crystalline structure; and
purging the GaN powder to prevent liquification of the powder.

8. The method of claim 7 wherein the grown GaN comprises single crystal GaN.

9. The method of claim 8 wherein the single crystal GaN forms a film.

10. The method of claim 7 wherein the GaN powder is exposed primarily to a nitrogen environment.

11. The method of claim 10 wherein the $N_2$ maintains a kinetic barrier for GaN decomposition.

12. The method of claim 10 wherein the inert gas is used for transporting the Ga vapor to the growth site.

13. The method of claim 7 wherein pressure is maintained at approximately 600 Torr.

14. A device for growing bulk crystals, the device comprising:
a container for holding a source powder to be vaporized;
a purging inlet located proximate the container for providing a purging gas containing $N_2$ to purge the powder;
a growth site located a distance from the container; and
a growth inlet located proximate the growth site for providing an inlet growth gas to be combined with the vapor from the container to form the bulk crystals on the growth site.

15. The device of claim 14 wherein the purging inlet prevents growth gas from the growth inlet from reacting with the source powder.

16. The device of claim 14 wherein the source powder comprises GaN.

17. The device of claim 14 wherein the source powder contains a dopant.

18. The device of claim 14 wherein the $N_2$ maintains a kinetic barrier for GaN decomposition.

19. The device of claim 14 wherein the inlet growth gas comprises $NH_3$.

20. The device of claim 14 wherein the growth cite comprises a seed holder.

21. The device of claim 20 wherein the seed holder comprises an annular boat formed of Boron Nitride.

22. The device of claim 14 wherein the distance between the container and the growth site is adjustable.

23. The device of claim 14 wherein the container comprises a pair of containers disposed on either side of the growth gas inlet.

24. A device for growing GaN, the device comprising:
means for generating a Ga vapor from a Ga containing powder;
means for transporting the Ga vapor to a growth site;
means for providing a nitride containing gas to the growth site to facilitate growth of GaN with a desired crystalline structure; and
means for purging the GaN powder with $N_2$.

25. A method of growing GaN, the method comprising:
generating a Ga vapor from a Ga containing powder by flowing a carrier gas of $N_2$ through the Ga containing powder;
transporting the Ga vapor to a growth site; and
providing a nitride containing gas proximate the growth site.

26. The method of claim 25 wherein the source powder comprises $Ga_2O_3$.

27. The method of claim 26 wherein the source powder further comprises C.

28. The method of claim 25 wherein the source powder contains a dopant.

29. The method of claim 25 wherein the nitride containing gas comprises $NH_3$.

30. The method of claim 25 wherein the temperature of the growth site is approximately 50 to 200° C. above the temperature of the Ga containing powder.

31. The method of claim 25 wherein the Ga vapor is transported through a frit prior to reaching the growth site.

32. A device for growing GaN, the device comprising:
a first inlet for an inert gas;
means for holding a source powder containing Ga and oxygen downstream from the first inlet;
means for purging the source powder with $N_2$;
a second inlet downstream from the means for holding the source powder for providing a nitride containing gas; and
a holder downstream from the second inlet for holding a seed for facilitating growth of crystalline GaN.

* * * * *